Figure 1:
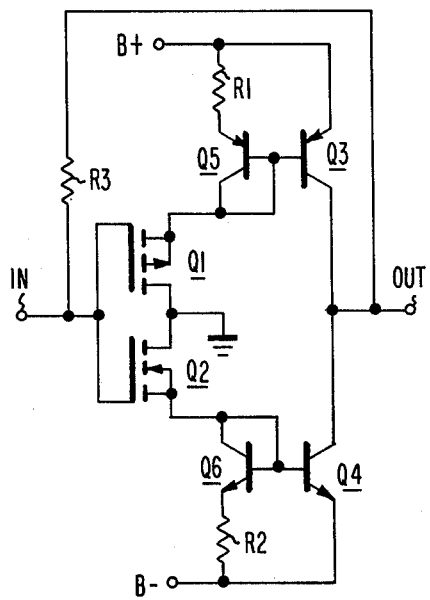

United States Patent [19]

Hoover

[11] 4,335,360
[45] Jun. 15, 1982

[54] CLASS AB PUSH-PULL AMPLIFIERS

[76] Inventor: Merle V. Hoover, R.D. #6, Box 220, Flemington, N.J. 08822

[21] Appl. No.: 97,040

[22] Filed: Nov. 23, 1979

[51] Int. Cl.³ .......................... H03F 3/16; H03F 3/30
[52] U.S. Cl. ................................... 330/264; 330/265; 330/288; 330/300
[58] Field of Search ............... 330/264, 265, 288, 257, 330/300

[56] References Cited

U.S. PATENT DOCUMENTS 4,092,612  5/1978  Schade, Jr. ........................ 330/264

FOREIGN PATENT DOCUMENTS 1447528  8/1976  United Kingdom .
1494941 12/1977  United Kingdom .
1507525  4/1978  United Kingdom .
1525751  9/1978  United Kingdom .

OTHER PUBLICATIONS

J. A. Roberts, K. Rowlands, "M.O.S. Bipolar Amplifiers", Wireless World, Jul. 1969, pp. 328-330.

Primary Examiner—James B. Mullins
Assistant Examiner—Gene Wan

[57] ABSTRACT

Class AB push-pull amplifiers using a pair of complementary metal-oxide-semiconductor CMOS field effect transistors in source-follower connections in its driver stage and using a pair of non-linear current amplifiers with complementary conduction characteristics in its push-pull output stage.

9 Claims, 3 Drawing Figures

CLASS AB PUSH-PULL AMPLIFIERS

The present invention is embodied in Class AB push-pull amplifiers using a pair of complementary metal-oxide-semiconductor (CMOS) field effect transistors in source-follower connections in its driver stage and using a pair of non-linear current amplifiers with complementary conduction characteristics in its push-pull output stage.

Amplifiers of this type are advantageous in that their transconductances and thus their overload characteristics are determined by the field effect transistors (FET's) in the driver stage. In audio amplifiers this results in the sound characteristics normally associated with vacuum tube amplifiers, and the "vacuum-tube" sound is preferred by critical listeners over the "transistor sound" associated with conventional transistor amplifiers using bipolar transistors, when listening to music amplified to peaks beyond the relatively distortion-free linear range of the amplifier.

Figure 2:
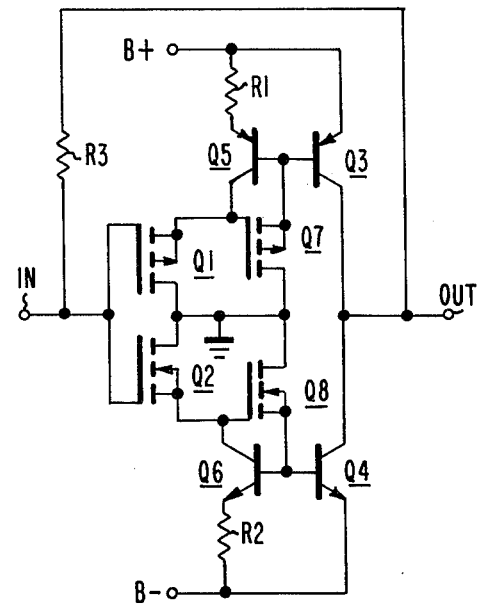
Figure 3:
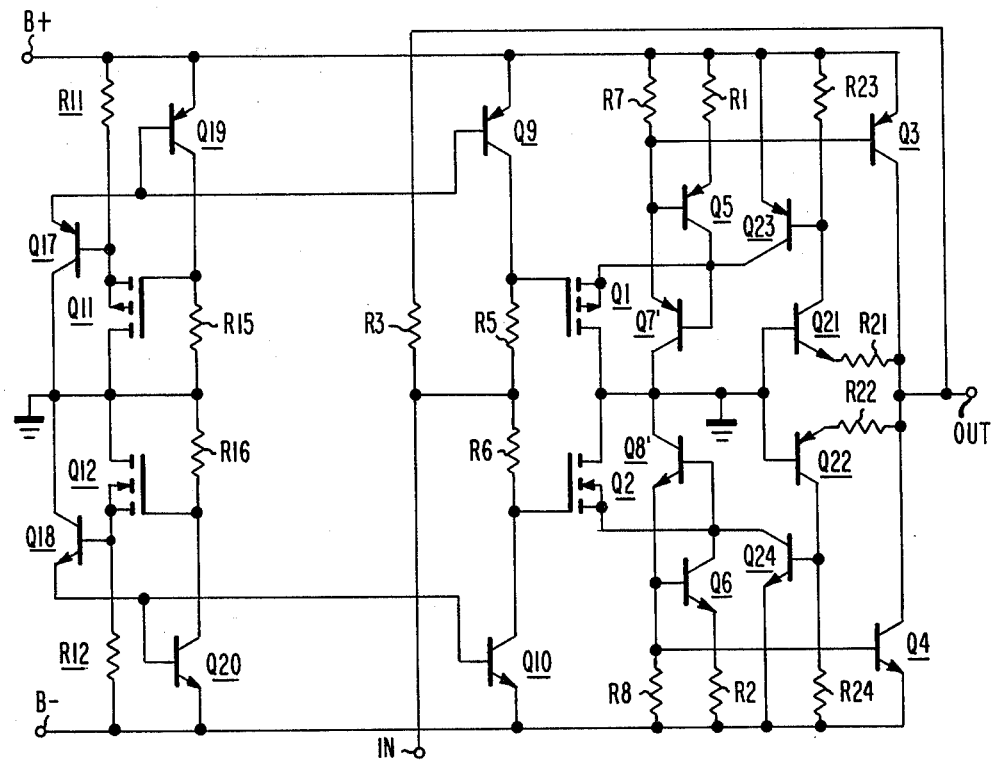

In the drawing:

Each of the FIGS. 1, 2 and 3 is a schematic diagram of a transformerless Class AB push-pull amplifier embodying the present invention.

In FIG. 1 p-channel driver transistor Q1 and n-channel driver transistor Q2 are a CMOS pair with respective gate electrodes directly connected to the input signal terminal IN. Each is connected in common-drain-amplifier or source-follower configuration. PNP transistor Q3 (with emitter connected to receive relatively positive B+ operating supply voltage) and NPN transistor Q4 (with emitter connected to receive relatively negative B− operating supply voltage) are in respective common-emitter amplifier configurations with each of their collectors connected to output signal terminal OUT; this complementary amplifier structure provides the push-pull output stage for supplying output signal to subsequent load means (not shown) connecting between terminal OUT and a ground reference voltage midway between B+ and B− voltages. Alternatively, terminal OUT may be connected by blocking capacitor to one end of the load means, the other end being connected to one of the B+ and B− operating supply voltage busses, in accordance with conventional practice.

Diode-connected PNP transistor Q5 and resistor R1 are connected in series between the base and emitter of Q3 to form a first non-linear, three-terminal current amplifier with Q3. This first non-linear amplifier has its input connection to the source of Q1, its common connection to B+ supply voltage bus, and its output connection to terminal OUT. Resistor R1 has a resistance $R_1$ so chosen that the potential drop thereacross under quiescent, or idling, conditions is negligibly small. Under these conditions the non-linear current amplifier operates like the current mirror amplifier that would be formed if the connection between Q5 and Q3 through R1 were replaced by direct connection. The source current of Q1 is amplified by a factor equal to the ratio of the collector current versus emitter-to-base voltage characteristic of Q3 to the emitter current versus emitter-to-base voltage characteristic of Q5 for similar respective emitter-to-base voltages.

Diode-connected NPN transistor Q6 and resistor R2 are connected in series between the base and emitter of Q4 to form a second non-linear, three-terminal current amplifier with Q4. This second non-linear amplifier has its input connection to the source of Q2, its common connection to B− supply voltage bus, and its output connection to terminal OUT. Q4 and Q6 are so proportioned and the resistance $R_2$ of R2 so chosen that this second non-linear amplifier has substantially the same current gain versus applied source current as the first non-linear amplifier. So, inasmuch as FET's Q1 and Q2 have complementary conduction characteristics, the quiescent collector currents of Q3 and Q4 will be equal when terminal IN is midway between B− and B+ supply voltages. Direct-coupling terminal OUT to terminal IN via resistor R3 completes a degenerative common-mode feedback connection that will equalize the collector currents of Q3 and Q4 by biasing terminal IN to this voltage midway between B− and B+ operating voltages. Input signal can be applied to terminal IN via a blocking capacitor, so this feedback biasing arrangement will not be hampered in its operation. The voltage gain of the amplifier will be determined by the resistance of $R_S$ of the input signal generator (not shown in the drawing) and will have a value $[(R_3/R_S)+1]$.

Positive excursions of input signal voltage applied to terminal IN will decrease the source current demanded by Q1 to reduce the collector current of Q3 proportionately. The source current supplied by Q2 will be increased, increasing the collector current of Q4 nearly exponentially. Terminal OUT will sink current from any load means, and the voltage at terminal OUT will be pulled towards B− supply voltage, so long as it is not short-circuit loaded.

Negative excursions of input signal voltage applied to terminal IN will, on the other hand, decrease the source current available from Q2 to reduce the collector current of Q4 proportionately. The source current demanded by Q1 will be increased, increasing the collector current of Q3 nearly exponentially. Terminal OUT will source current to any load means, and the voltage at terminal OUT will be pulled towards B+ supply voltage, so long as it is not short-circuit loaded.

If the portion of the difference between the B− and B+ supply voltages available as the combined source-to-drain voltage of Q1 and drain-to-source voltage of Q2 is chosen smaller than the sum of the threshold values of the respective source-to-gate voltages $V_{GS\text{-}Q1}$ and $V_{GS\text{-}Q2}$ of Q1 and Q2, then the biasing of the push-pull amplifier for Class AB operation will be enhanced by Q1 and Q2 operating in their square-law regions during cross-over in conduction between them. In the FIG. 1 amplifier the sum of the respective source-to-gate voltages $V_{GS\text{-}Q1}$ and $V_{GS\text{-}Q2}$ of Q1 and Q2 equals the difference between B− and B+ operating voltages less the relatively small sum of the respective emitter-to-base offset voltages $V_{BEQ5}$ and $V_{BEQ6}$ of Q5 and Q6. As the difference between B− and B+ voltages grows larger, it greatly exceeds the sum of $V_{GS\text{-}Q1}$ and $V_{GS\text{-}Q2}$ associated with square-law operation in the enhancement-mode CMOS transistors widely used at present, and a push-pull amplifier like that shown in FIG. 1 would require CMOS transistors of special high-$V_{GS}$ design. One way to accommodate CMOS transistors of conventional design is to modify the FIG. 1 push-pull amplifier by inserting offset voltage generating means between the source of Q1 and the base of Q3 and by inserting other offset voltage generating means between the source of Q2 and the base of Q4. These offset voltage generating means might comprise respective avalanche diodes, for example, or additional source-follower FET's.

FIG. 2 shows a modification of the FIG. 1 amplifier to accommodate a twice larger difference between B− and B+ voltages, carried out so as also to accommodate larger current gains in the non-linear current amplifiers including Q3 and Q4 respectively as output transistors. P-channel source-follower transistor Q7 has the source of Q1 connected to its gate and has its source connected to the bases of Q3 and Q5. Rather than having the collector of Q5 connect to the base of Q3, however, it remains connected to the source of Q1, so that Q7 is incorporated with R1, Q3 and Q5 in the non-linear current amplifier. The base currents of bipolar transistors Q3 and Q5 no longer form a portion of the source current of Q1. Only the collector current of Q5 flows as source current to Q1, excepting current to discharge stray capacitance at the source of Q1. Similarly, n-channel source-follower transistor Q8 has the source of Q2 connected to its gate and has its source connected to the bases of Q4 and Q6; and Q6 has its collector connected to the source of Q2, so only the collector current of Q6 is supplied from the source of Q2, excepting for current to charge stray capacitance at the source of Q2. Now, Q3 and Q4 can be made so their collector currents versus given emitter-to-base voltages are very large without their attendant large base currents hogging the source currents of Q1 and Q2 from the collectors of Q5 and Q6. So, Q5 and Q6 can respond with collector currents equalling the source currents of Q1 and Q2, respectively, and can cooperate with resistors R1 and R2, respectively, to control the non-linearity of the collector current responses of Q3 and Q4, respectively.

Another way to accommodate CMOS transistors of conventional design in the FIG. 1 push-pull amplifier is to modify it by inserting offset voltage generating means between terminal IN and the gate of Q1 and by inserting other offset voltage generating means between terminal IN and the gate of Q2. Both ways can be used in concert, also.

The use of offset voltage generating means that generate fixed offset voltages requires that the designer known what the difference between B− and B+ supply voltages is to be. A push-pull amplifier operable over a range of differences between B− and B+ supply voltage is, however, often desired.

Offset voltage generating means that generate offset voltages between the gates of CMOS transistors in inverting amplifier connections are described by Adel Abdel Aziz Ahmed in a concurrently filed U.S. patent application Ser. No. (RCA 71,510) entitled "AMPLIFIER WITH CROSS-OVER CURRENT CONTROL" and assigned like the present application to RCA Corporation.

FIG. 3 shows a push-pull amplifier wherein in accordance with Ahmed's teaching, the sum of the offset voltages, $(V_{GS-Q1}+V_{GS-Q2})$, is determined by the difference in B− and B+ supply voltage, less the sum of the $V_{GS}$'s of a p-channel FET and an n-channel FET operated at given drain current level, less appropriate $V_{BE}$ offset voltages to compensate for the input offset voltages of the non-linear current amplifiers Q1 and Q2 are called upon to drive. The quiescent value of $V_{GS-Q1}$ is determined by the voltage drop appearing across resistor R5 responsive to the collector current of PNP transistor Q9; and the quiescent value of $V_{GS-Q2}$ is determined by the voltage drop appearing across resistor R6 responsive to the collector current of NPN transistor Q10. The collector currents of Q9 and Q10 are set up to be equal in magnitude in a way presently to be explained, and the overall direct-coupled feedback applied from terminal OUT to terminal IN via resistor R3 will supply any discrepancy between these collector currents, slightly offsetting the quiescent voltages between terminals IN and OUT from each other.

P-channel FET Q11, similar in conduction characteristics to Q1, is connected in common-drain amplifier connection to draw current through its source resistor R11 responsive to the forward-biasing of its gate electrode by resistor R15 connecting the gate to ground. As the voltage drop across R11 begins to exceed the sum of the emitter-to-base offset voltage $V_{BE-Q17}$ of PNP emitter-follower transistor Q17 and of the emitter-to-base voltage $V_{BE-Q19}$ PNP common-emitter amplifier transistor Q19, Q19 is biased into conduction to supply collector current. This collector current flows to ground via resistor R15 establishing a voltage drop thereacross which prevents substantial further increase in the voltage drop across R11. The voltage drop across R11 is thus established at a substantially fixed value equal to $(V_{BE-Q17}+V_{BE-Q19})$. The resistance of R11 is chosen to be of such value that the drop thereacross, which determines the current flow through R11 in accordance with Ohm's Law and establishes the source current of Q11, sets up a value of source current for Q11 equal to the desired source current for Q1.

The regulated emitter-to-base voltage of Q19 is applied as the emitter-to-base voltage $V_{BE-Q9}$ of Q9. The collector current versus emitter-to-base voltage characteristics of Q19 and Q9 are proportioned in the same ratio as the respective resistances of resistors R15 and R5, which results in the voltage drops across R15 and R5 being substantially equal to each other. Thus, Q1 is set up for the same level of quiescent conduction (i.e., channel current) as Q11.

N-channel FET Q12, resistors R12 and R16, and NPN bipolar transistors Q18 and Q20 operate analogously to p-channel FET Q11, resistors R11 and R15, and PNP bipolar transistors Q17 and Q19, respectively, to apply an emitter-to-base voltage $V_{BE-Q10}$ to Q10 that conditions it to conduct a collector current which drawn through R6 develops a $V_{GS-Q2}$ that biases Q2 for the same level of quiescent conduction as Q12. R11 and R12 have equal respective resistances $R_{11}$ and $R_{12}$ so that the quiescent conduction levels of Q11 and Q12, and thus those of Q1 and Q2, are alike. This reduces the discrepancy between the collector currents of Q9 and Q10 to minimize quiescent offset voltage between terminals OUT and IN.

R7 and R8 are simply a pull-up resistor for the base of Q3 and a pull-down resistor for the base of Q4 to speed up their turn-off on transitions of conduction from one to the other. It is undesirable from the standpoint of amplifier efficiency that Q3 and Q4 be simultaneously conductive, except insofar as needed to avoid distortion during cross-overs from conduction of either to the other.

This desire is further satisfied by incorporating load-line limiting circuitry into the FIG. 3 amplifier. Excursions of output signal voltage at terminal OUT are applied via resistor R21 to the emitter of grounded-base NPN transistor Q21 and are applied via resistor R22 to the emitter of grounded-base PNP transistor Q22. Negative excursions of the output signal voltage in excess of the emitter-to-base offset voltage $V_{BE-Q21}$ of Q21 bias Q21 into conduction to draw current through resistor R23 and develop a voltage drop thereacross. Sufficiently large negative excursion of the output signal voltage will increase the voltage drop across R23 sufficiently to bias PNP common-emitter-amplifier transistor Q23 into conduction to divert any remaining source current flow to Q1 from flowing in the input circuit of the non-linear current amplifier comprising Q3, Q5, Q7', R1 and R7. Accordingly, pull-up resistor R7 will definitely keep Q3 out of conduction during pronounced negative excursions of output signal voltage at terminal OUT.

Positive excursions of the output signal voltage in excess of the emitter-to-base offset voltage $V_{BE-Q22}$ of Q22 biases Q22 into conduction to draw current through resistor R24 and develop a voltage drop thereacross. Sufficiently large excursion of the output signal voltage will increase the voltage drop across R24 sufficiently to bias NPN common-emitter-amplifier transistor Q24 into conduction to divert any remaining source current from Q2 from flowing in the input circuit of the non-linear current amplifier comprising Q4, Q6, Q8', R2 and R8. So, pull-down resistor R8 will definitely keep Q4 out of conduction during pronounced positive excursions of output signal voltage at terminal OUT.

The FIG. 3 amplifier also differs from that of FIG. 2 in that p-channel source-follower FET Q7 and n-channel source-follower FET Q8 replace PNP emitter-follower bipolar transistor Q7' and NPN emitter-follower bipolar transistor Q8', respectively. This is done so Q17 and Q18, which compensate for the offset voltages of the follower transistors, may be bipolar transistors. The emitter-to-base offset voltages of PNP and NPN transistors tend to match more closely than the source-to-gate threshold voltages of p-channel and n-channel transistors, owing to the high transconductance of the bipolar transistors. This makes it easier to provide for equal Q11 and Q12 source currents by making $R_{11}$ and $R_{12}$ equal. Alternatively, Q7' and Q8' could be replaced by FET's Q7 and Q8; Q9, Q17 and Q19 being replaced by p-channel FET's; Q10, Q18 and Q20 being replaced by n-channel FET's; and R11 and R12 being replaced by a p-channel FET and by a n-channel FET, respectively, each self-biased by respective gate-to-drain connection.

One skilled in the art and armed with the foregoing disclosure will be able to design a variety of other push-pull amplifiers in accordance with the broader aspects of the invention described above, and this should be taken into account in the evaluation of the scope of the following claims. E.g., the drains of Q1 and Q2 can be connected to ground through a shared drain load resistor to develop voltage to be fed back to terminal IN via a resistor, in place of or in addition to feeding back the output signal voltage at terminal OUT via resistor R3. Or, the drains of Q1 and Q2 may connect to B− supply voltage bus and to B+ supply voltage bus, respectively, rather than to ground. Quasi-complementary, rather than the complementary arrangements, can be used for the non-linear current amplifiers following source-follower transistors Q1 and Q2. E.g., Q1 may be a composite transistor having its "base" electrode at the base of a common-emitter-amplifier component PNP transistor supplying its collector current as input current to the input terminal of a current mirror amplifier (CMA) connection of NPN component transistors, having its "collector" electrode at the common terminal of that CMA connection, and having its "emitter" electrode at an interconnection of the output terminal of that CMA connection and the emitter electrode of the component PNP transistor. The non-linear current amplifiers in FIGS. 1, 2 and 3 may use FET's in place of Q3, Q4, Q5 and Q6.

What I claim is:

1. A Class AB push-pull amplifier comprising:
    a signal input terminal and a signal output terminal;
    first and second supply terminals for receiving a relatively positive first operating voltage and a relatively negative second operating voltage respectively;
    first and second field effect transistors respectively of p-channel and of n-channel conductivity types, each having respective source and drain electrodes defining the ends of its channel for conducting current and having a respective gate electrode; said first and second field effect transistors having matched current conduction versus source-to-gate voltage characteristics;
    means connecting said first and second field effect transistors for operating them as source followers between said signal input terminal and their respective source electrodes; and
    first and second current amplifiers of complementary conductivity having respective input connections to the source electrode of said first field effect transistor and to the source electrode of said second field effect transistor, having respective common connections to said first supply terminal and to said second supply terminal, having respective output connections to said signal output terminal, and having matched current gains between their respective input and output connections for levels at least as large as the quiescent levels of conduction in said first and second field effect transistors, wherein said first and second current amplifiers are non-linear current amplifiers each having a current gain between its input and output connections which increases with increasing current through its input connection.

2. A Class AB push-pull amplifier as set forth in claim 1 with means for providing direct-coupled feedback from its output signal terminal to its input signal terminal.

3. A Class AB push-pull amplifier as set forth in claim 2 wherein said first current amplifier includes a PNP bipolar transistor with base, emitter and collector electrodes connected to its input, common and output connections respectively; and wherein said second current amplifier includes an NPN bipolar transistor with base, emitter and collector electrodes connected to its input, common, and output connections, respectively.

4. A Class AB push-pull amplifier comprising:
    first and second field effect transistors respectively of p-channel type and of n-channel type; each having respective gate, source, and drain electrodes;
    first and second bipolar transistors respectively of PNP type and of NPN type, each having respective base, emitter, and collector electrodes and having a respective base-emitter junction between its base and emitter electrodes;
    an input signal terminal;
    means connecting said input signal terminal to the gate electrode of said first field effect transistor;
    means connecting said input signal terminal to the gate electrode of said second field effect transistor;
    means for direct coupling the source electrode of said first field effect transistor to the base electrode of said first bipolar transistor, which means is of a type co-acting with said first bipolar transistor to provide a first non-linear amplifier with current gain that increases with increase in the source current supplied to it from said first field effect transistor;

means for direct coupling the source electrode of said second transistor to the base electrode of said second bipolar transistor, which means is of a type co-acting with said second bipolar transistor to provide a second non-linear amplifier with current gain that increases with increase in the source current supplied to it from said second field effect transistor;

means for applying a relatively positive first operating voltage to the emitter electrode of said first bipolar transistor;

means for applying a relatively negative second operating voltage to the emitter electrode of said second bipolar transistor;

means for applying voltages in a range including said first and second operating voltages to the drain electrodes of said first and second field effect transistors; and an output signal terminal to which each of the collector electrodes of said first and second bipolar transistors connect.

5. A Class AB push-pull amplifier as set forth in claim 4 wherein said means for direct coupling the source electrode of said first field effect transistor to the base electrode of said first bipolar transistor includes in parallelly conductive connection with the base-emitter junction of said first bipolar transistor;

a resistor and diode means in series connection between the base electrode of said first bipolar transistor and said means for applying a relatively positive operating voltage.

6. A Class AB push-pull amplifier as set forth in claim 4 wherein said means for direct coupling the source electrode of said second field effect transistor to the base electrode of said second bipolar transistor includes in parallelly conductive connection with the base-emitter junction of said second bipolar transistor;

a resistor and diode means in series connection between the base electrode of said second bipolar transistor and said means for applying a relatively negative operating voltage.

7. A Class AB push-pull amplifier as set forth in claim 4 wherein said means for direct coupling the source electrode of said first field effect transistor to the base electrode of said first bipolar transistor includes in parallelly conductive connection with the base-emitter junction of said first bipolar transistor:

a first resistor and first diode means in series connection between the base electrode of said first bipolar transistor and said means for applying a relatively positive operating voltage and wherein said means for direct coupling the source electrode of said second field effect transistor to the base electrode of said second bipolar transistor includes in parallelly conductive connection with the base-emitter junction of said second bipolar transistor:

a second resistor and second diode means in series connection between the base electrode of said second bipolar transistor and said means for applying a relatively negative operating voltage.

8. A Class AB push-pull amplifier as set forth in claim 4 wherein said means for direct coupling the source electrode of said first field effect transistor to the base electrode of said first bipolar transistor includes:

a further PNP bipolar transistor having base, emitter, and collector electrodes;

a node to which the source electrode of said first field effect transistor and the collector electrode of said further PNP transistor each connect;

means for direct coupling that node to the base electrodes of said first and further PNP bipolar transistors; and resistive means between the emitter electrodes of said first and further PNP bipolar transistors for degenerating the collector current versus emitter-to-base voltage gain characteristic of said further PNP bipolar transistor at higher levels of its emitter current.

9. A Class AB push-pull amplifier as set forth in claim 4 or 8 wherein said means for direct coupling the source electrode of said second field effect transistor to the base electrode of said second bipolar transistor includes:

a further NPN bipolar transistor having base, emitter, and collector electrodes;

a node to which the source electrode of said first field effect transistor and the collector electrode of said further PNP transistor each connect;

means for direct coupling that node to the base electrodes of said second and further NPN bipolar transistors; and resistive means between the emitter electrodes of said second and further NPN bipolar transistors for degenerating the collector current versus emitter-to-base voltage gain characteristic of said further NPN bipolar transistor at higher levels of its emitter current.

* * * * *

UNITED STATES PATENT AND TRADEMARK OFFICE
CERTIFICATE OF CORRECTION

PATENT NO. : 4,335,360
DATED : June 15, 1982
INVENTOR(S) : Merle Vincent Hoover

It is certified that error appears in the above-identified patent and that said Letters Patent is hereby corrected as shown below:

On the title page, Insert

-- (73) Assignee: RCA Corporation --.

Signed and Sealed this

Twenty-third Day of November 1982

[SEAL]

Attest:

GERALD J. MOSSINGHOFF

Attesting Officer     Commissioner of Patents and Trademarks